(12) United States Patent
Kao

(10) Patent No.: US 6,713,399 B1
(45) Date of Patent: Mar. 30, 2004

(54) CARBON-CONDUCTIVE INK RESISTOR PRINTED CIRCUIT BOARD AND ITS FABRICATION METHOD

(75) Inventor: Hsi-Song Kao, Chung Li (TW)

(73) Assignee: Uni-Circuit Inc. (TW)

( * ) Notice: Subject to any disclaimer, the term of this patent is extended or adjusted under 35 U.S.C. 154(b) by 0 days.

(21) Appl. No.: 10/325,919

(22) Filed: Dec. 23, 2002

(51) Int. Cl.$^7$ ............................................. H01L 21/311
(52) U.S. Cl. ...................... 438/700; 438/754; 438/778
(58) Field of Search .................... 438/700, 720, 438/734, 742, 754, 778

(56) References Cited

U.S. PATENT DOCUMENTS 5,912,503 A * 6/1999 Chan et al.

* cited by examiner

Primary Examiner—Phuc T. Dang
(74) Attorney, Agent, or Firm—Birch, Stewart, Kolasch & Birch, LLP

(57) ABSTRACT

A embedded resistor printed circuit board fabrication includes the steps of preparing a substrate having a top conductive layer and a bottom insulating layer and etching the top conductive layer to form a first conductive layer having recesses in it; embedding resistive material in the recesses, enabling the first conductive layer to be electrically connected to lateral sides of the resistive material; plating a thin conductive film on the first conductive layer and the resistive material to form a second conductive layer; and etching the first conductive layer and second conductive layer to let the second conductive layer be electrically connected to the thin film type resistors.

12 Claims, 5 Drawing Sheets

CARBON-CONDUCTIVE INK RESISTOR PRINTED CIRCUIT BOARD AND ITS FABRICATION METHOD

BACKGROUND OF THE INVENTION

1. Field of the Invention

The present invention relates to a printed circuit board fabrication method and, more particularly, to a fabrication method for forming a printed circuit board having thin film resistors embedded in its circuitry traces.

2. Description of the Related Art

The rapid trend of miniaturization in electronic products requires corresponding reduction in the form factor of electronic components and printed circuit boards. One means of achieving this is to replace discrete passive devices with embedded ones. The so-called embedded design is to make passive devices such as resistors or capacitors in a thin film, and then directly embed these devices in a printed circuit board during the fabrication of the board, enabling the embedded thin film passive devices to be integrated with the circuitry traces and active components on the outer layers of the printed circuit board. Exemplars of this design are seen in U.S. Pat. Nos. 5,079,069; 5,155,655; 5,161,086; 5,261,153; 5,347,258; and 5,466,892.

In embedded passive devices such as embedded resistors, unit thickness resistivity is dependent on the resistive material, and the width of the resistor is dependent on the conductor pattern. Normally, good resistive material has high electrical resistivity and low temperature coefficient of resistivity (TCR), and is easy to process. Suitable materials for embedded resistors comprise two types, namely, thin film metal alloys such as NiP, NiWP, NiCr, and NiCrAlSi, and polymer thick films (PTF) such as inductive composites. In the standard printed circuit board fabrication method, the outer metal layers are etched into circuitry traces, and then passive material is coated on the circuitry traces. If metal alloy thin film material is used, it can be coated on the circuitry traces by electroplating, sputtering, electroless plating, or chemical vapor deposit (CVD). When polymer thick film material is used, it is coated on the circuitry traces using the screen-printing method.

The main drawback of the conventional embedded resistor fabrication process is the large variation in resistance due to device resistivity not matching the circuit impedance. The error range, series inductance, and inductive resistance of the device itself cause the device resistivity not to match the circuit impedance. However, because series inductance and inductive resistance are insignificant, they can be ignored.

The variation in resistance of embedded resistors of metal alloy thin film material is low, but thin film metal alloy embedded resistors have low resistivity. Embedded resistors of polymer thick film material are commonly made of epoxy resin-based material with high resistivity. However, the resistance variation in polymer thick film embedded resistors is high. Therefore, it is desirable to have a printed circuit board fabrication method that eliminates the aforesaid drawbacks. FIG. 1 shows a printed circuit board 1 having carbon resistors 2 embedded therein and electrically connected to the circuitry traces 3 on the top side thereof. In order to minimize the resistance variation, every carbon resistor 2 is made having the same geometric shape. However, when carbon resistors 2 are embedded in the printed circuit board 1, they may have different shapes (see FIGS. 2A~2D), and an open circuit may form between embedded carbon resistors 2 and the circuitry traces 3. When an open circuit forms between an embedded carbon resistor 2 and the circuitry traces 3, the embedded carbon resistor 2 fails to function.

SUMMARY OF THE INVENTION

The present invention has been accomplished under the circumstances in view. It is therefore the main object of the present invention to provide an embedded resistor printed circuit board fabrication method which eliminates the drawbacks of the prior art designs by maintaining the shape of the embedded resistors. In the fabrication method of the present invention, the first step is to prepare a substrate having a conductive layer on top and an insulating layer underneath and then to etch the conductive layer such that it has a number of recesses. Thereafter, resistive material is embedded in the recesses, enabling the first conductive layer to be electrically connected to the lateral edges of the resistive material. Next, a second conductive layer is plated on top of the first conductive layer and the resistive material, and then a layer of etch resist is coated on the second conductive layer with apertures smaller than the recesses above the resistive material. Finally, the first and second conductive layers are etched, leaving a conductive pattern with two layers, both electrically connected to the fully formed resistors. Further, multiple embedded resistor printed circuit boards made according to the aforesaid method may be laminated together, forming a multi-layer printed circuit board. Further, a embedded resistor printed circuit board according to the present invention comprises an insulation layer; a first conductive layer laid on top of the insulation layer and defining a number of recesses; resistive material embedded in the recesses and electrically connected to the first conductive layer; and a second conductive layer laid over the top side of the first conductive layer opposite to the insulation layer, such that the first conductive layer, the resistive material, and the second conductive layer are integrated into an electrical circuit, the two conductive layers having been etched into a conductor pattern.

DETAILED DESCRIPTION OF THE
PREFERRED EMBODIMENT

The invention is to form embedded resistors during the printed circuit board manufacturing process, enabling the resistance variation of the embedded resistors to be minimized. The minimized variation is achieved by fixing all embedded resistors in the same geometric shape. The invention is described hereinafter by way of the example of carbon resistors.

Figure 1:
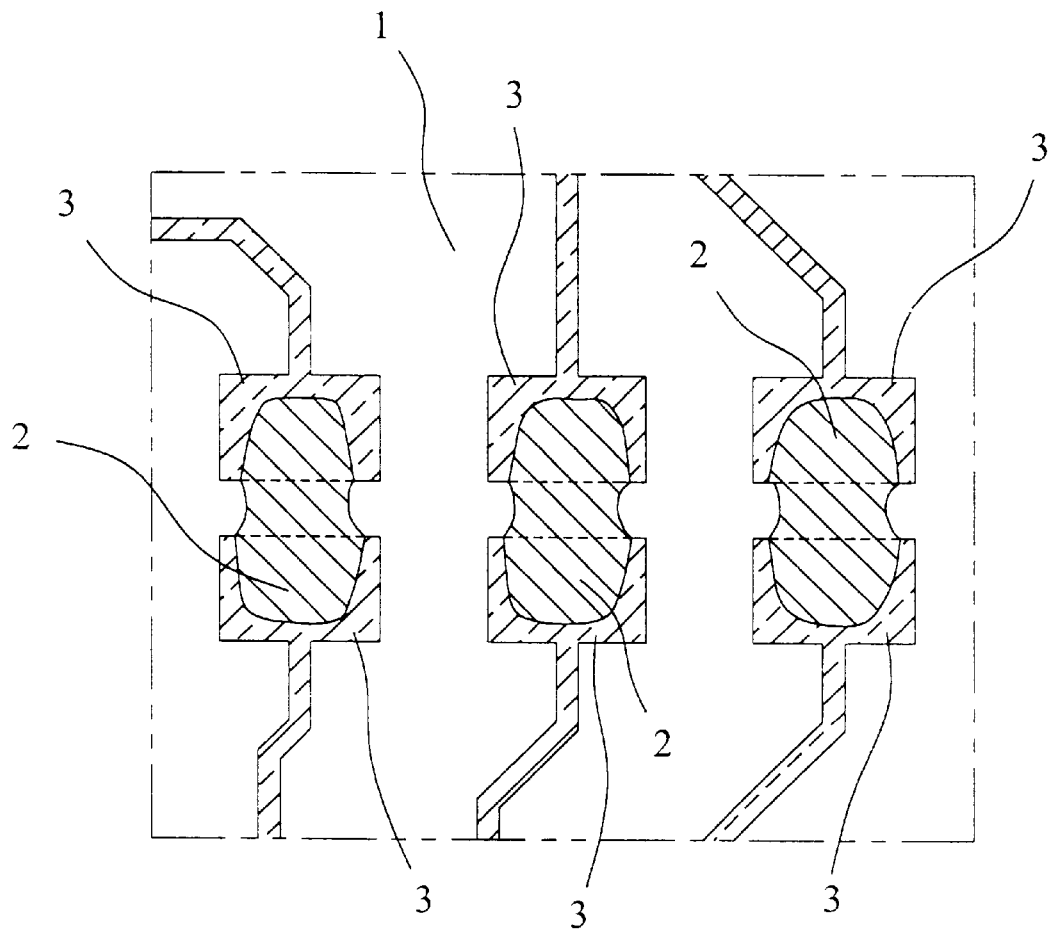
FIG. 1 is a top view showing carbon resistive material embedded in circuitry traces on a printed circuit board according to the prior art.
Figure 2A:
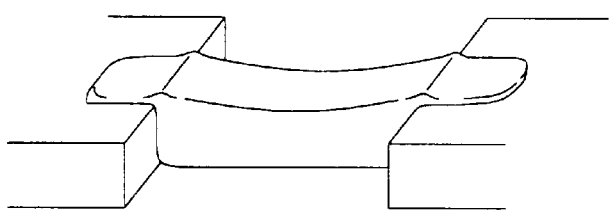
FIGS. 2A~2D show different shapes of carbon resistors formed according to the prior art method.
Figure 2B:
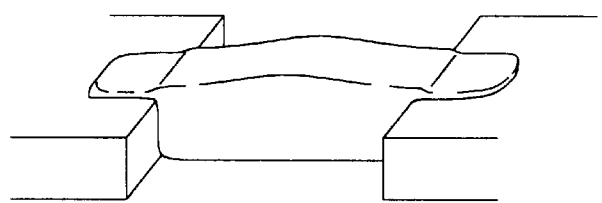
Figure 2C:
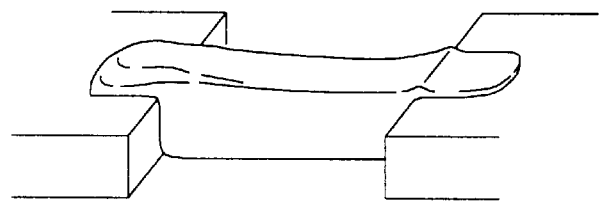
Figure 2D:
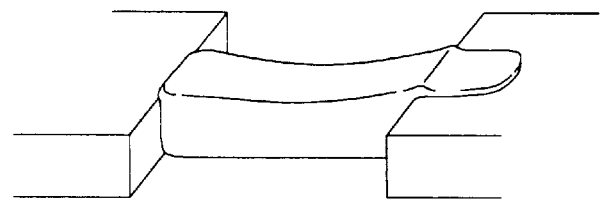
Figure 3:
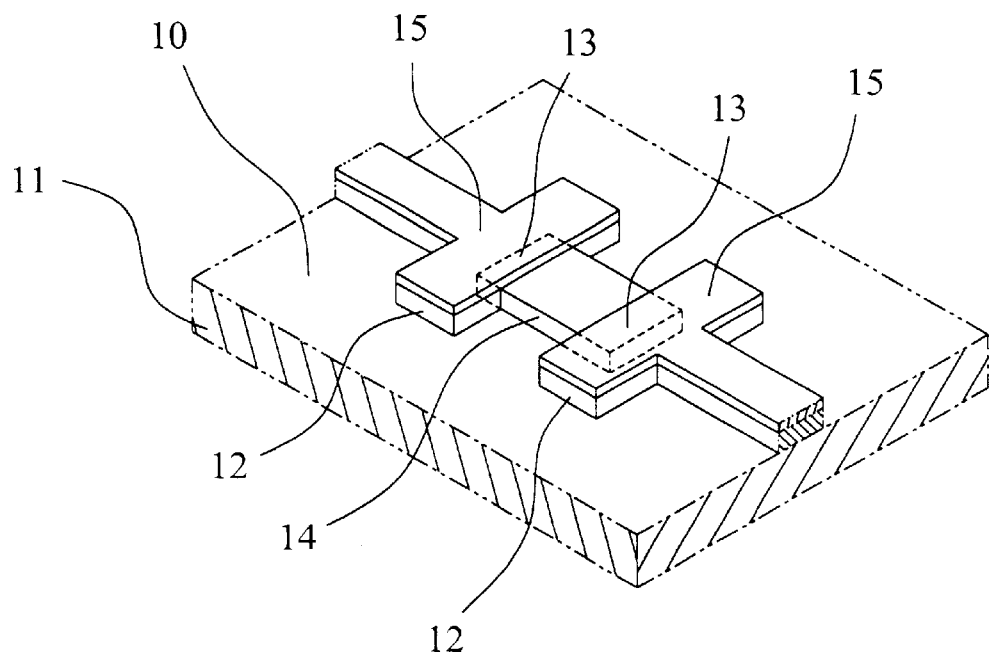
FIG. 3 is a perspective view of the embedded resistor printed circuit board according to the present invention.

The method of forming embedded resistor printed circuit boards is mainly to form a circuit substrate 10 having circuitry traces and multiple thin film type resistors. As illustrated in FIG. 3, the circuit substrate 10 is a printed circuit board. The top side of the circuit substrate is a conductive layer, for example, a copper layer. The bottom side of the circuit substrate 10 is an insulating layer 11 of compound material, for example, epoxy resin composite. The top conductive layer of the circuit substrate 10 is etched into a first layer 12 on the top surface of the insulating layer 11. The first layer 12 is etched with recesses 13. Thin film resistive material 14 is embedded in the recesses 13 of the first conductive layer 12, such that it is electrically connected to the first conductive layer 12.

A second conductive layer 15 is formed on the top surface of the first conductive layer 12. The second conductive layer 15 protrudes over the recesses 13, and is laid over the embedded resistive material 14. Therefore, the first conductive layer 12, the embedded resistive material 14 and the second conductive layer 15 are integrated into an electrical circuit, keeping the embedded thin film type resistors 14 in shape and position and minimizing the variation of error of the embedded thin film type resistors 14.

Figure 4:
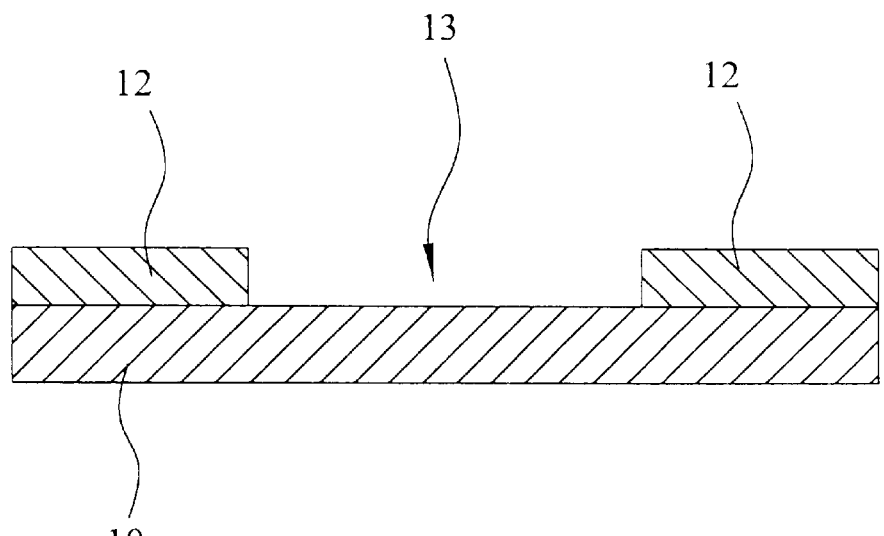
FIG. 4 is a side view in section showing a first conductive layer formed on the top surface of the insulating layer with recesses in it according to the present invention.
Figure 5:
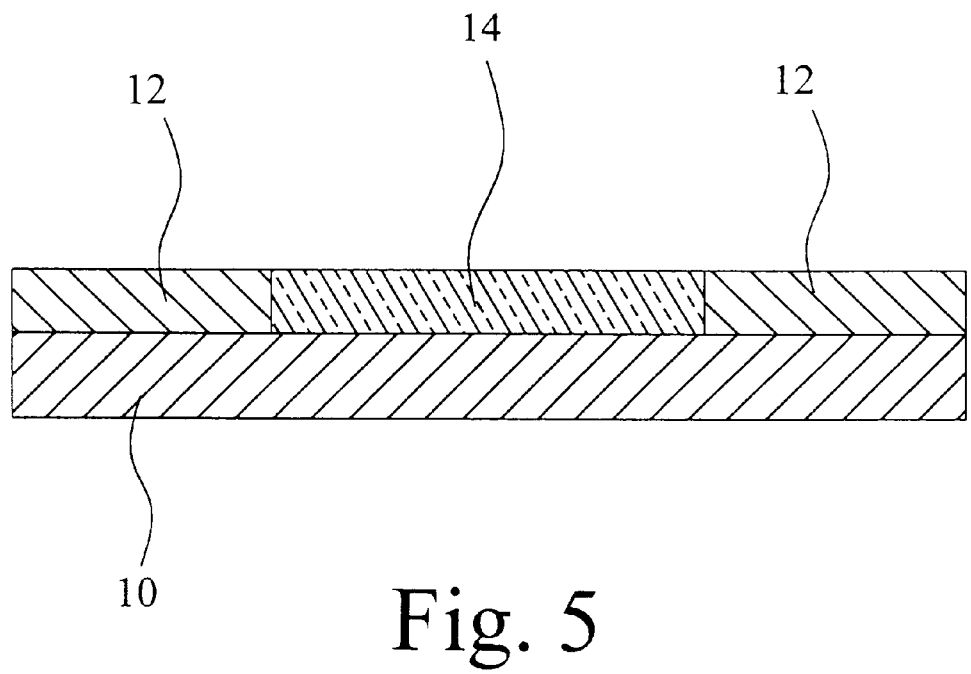
FIG. 5 is similar to FIG. 4 but showing thin film resistive material embedded in the first conductive layer according to the present invention.

FIG. 4 is a side view in section of the aforesaid circuit substrate 10. The top conductive layer of the circuit substrate 10 is etched, forming the aforesaid first conductive layer 12 and the aforesaid recesses 13 in the first layer 12. After formation of the first conductive layer 12 and the recesses 13 in the first conductive layer 12, thin film resistive material 14 is embedded in the recesses 13 as shown in FIG. 5. According to the present preferred embodiment, the resistive material 14 is carbon film embedded in the recesses 13 by screen printing. In order to prevent the formation of air bubbles or an insufficient deposit of carbon, carbon material is screen-printed into each recess 13 twice, in opposite directions each time. After printing, a ceramic brush is used to level the duly printed resistive material 14, keeping the resistive material 14 flush with the first conductive layer 12. Because the shape of each recess 13 is fixed, the shape of the resistive material 14 formed in each recess 13 is fixed, and the first conductive layer 12 is electrically connected to the lateral sides of the embedded thin film type resistors 14.

Figure 6:
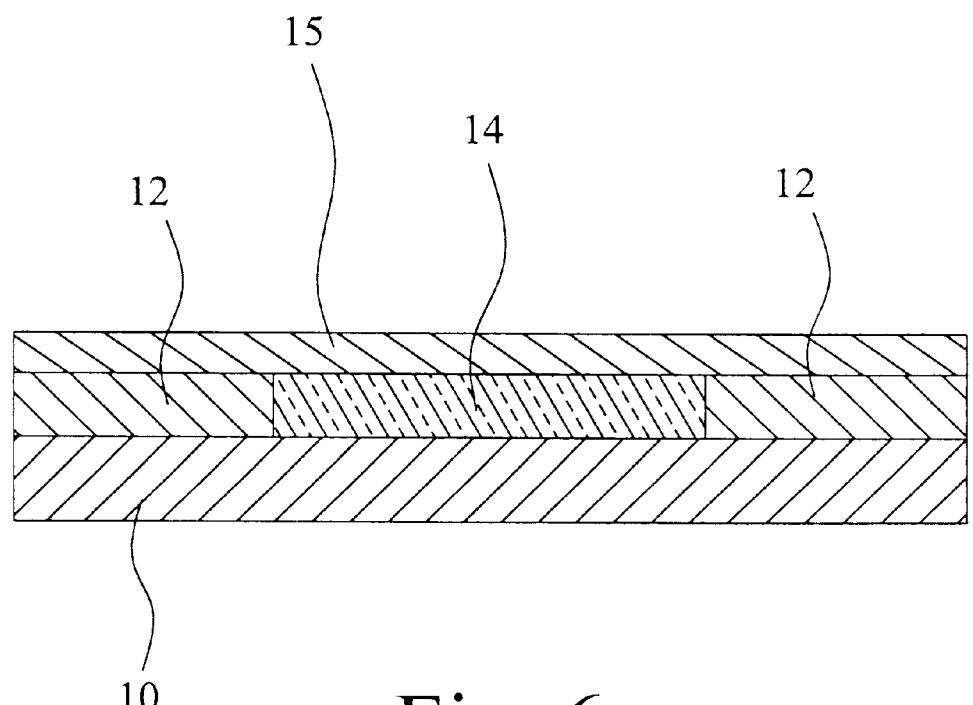
FIG. 6 is similar to FIG. 5 but showing a second conductive layer covering the first conductive layer and the embedded resistive material according to the present invention.
Figure 7:
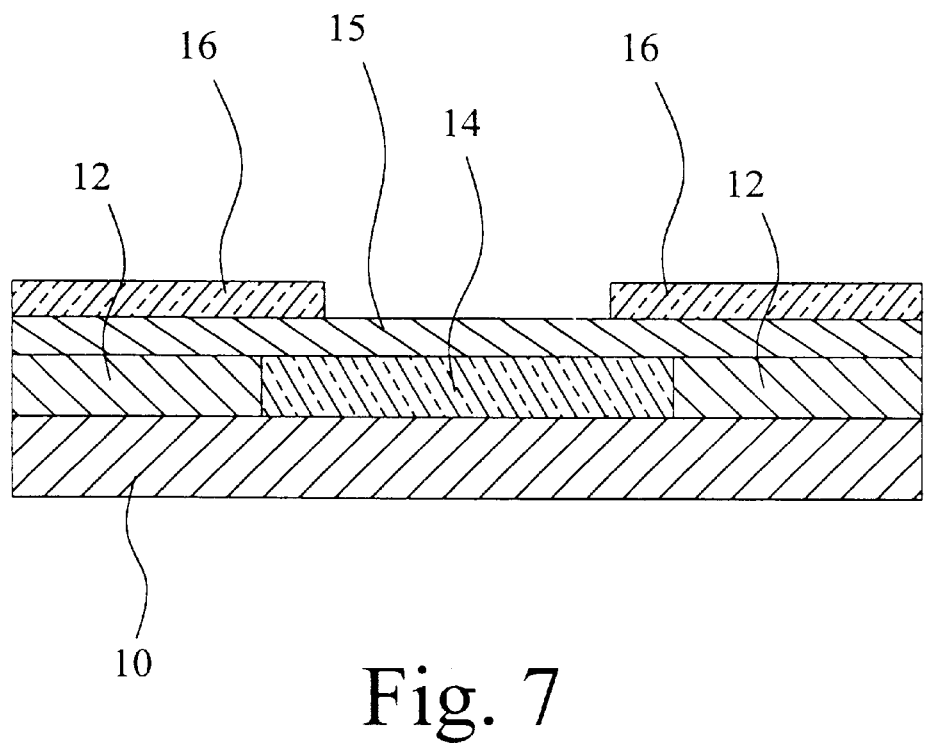
FIG. 7 is similar to FIG. 6 but showing a layer of etch resist coated on the second conductive layer according to the present invention.
Figure 8:
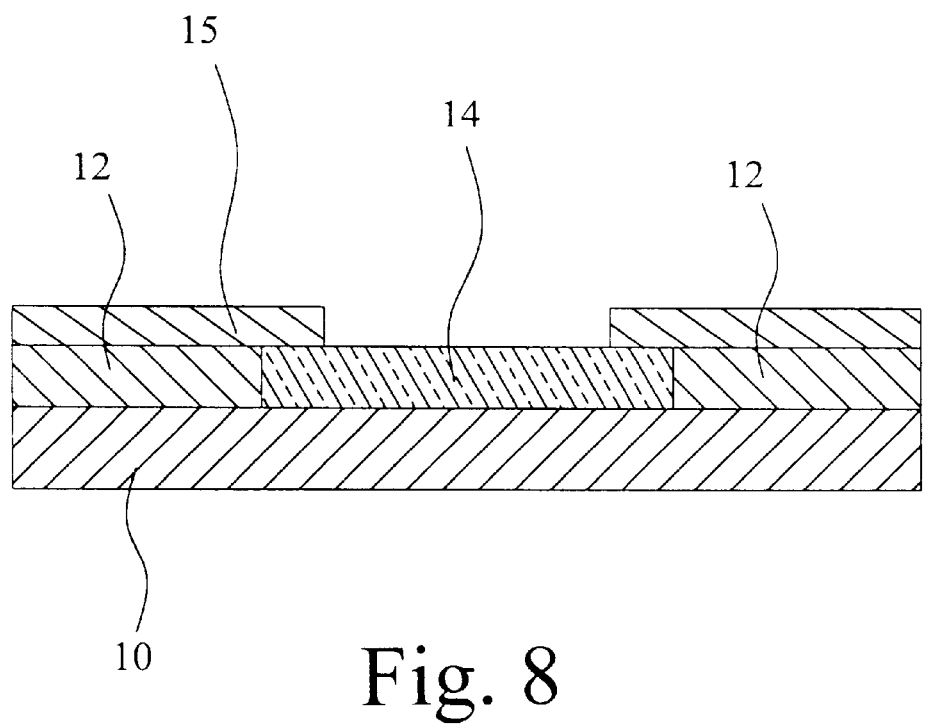
FIG. 8 is a side view of the finished embedded resistor printed circuit board according to the present invention.

FIG. 6 shows the aforesaid second conductive layer 15 on the assembly of FIG. 5. After embedding resistive material 14 in the circuit substrate 10, a further conductive layer is plated on the top surface of the first conductive layer 12 and the embedded thin film type resistors 14, forming the second conductive layer 15. Further, the second conductive layer 15 covers the embedded resistive material 14. After formation of the second conductive layer 15, a layer of etch resist 16 is coated on the top surface of the second conductive layer 15 with apertures smaller than the recesses 13 above the embedded resistive material 14 (see FIG. 7 and also FIG. 4), and then the first conductive layer 12 and the second conductive layer 15 are etched at locations corresponding to the embedded thin film resistors 14, enabling the second conductive layer 15 to be electrically connected to the embedded thin film type resistors 14. After etching, the layer of resist 16 is removed from the second conductive layer 15, and the manufacturing process of the present invention is complete. FIG. 8 is a side view in section of the finished embedded resistor printed circuit board.

A prototype of the embedded resistor printed circuit board and its fabrication method has been constructed with the features of FIGS. 3~8. Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. An embedded resistor printed circuit board fabrication method for forming circuit substrates having circuitry traces and embedded resistors, the method comprising the steps of:

a. preparing a substrate having a top conductive layer and a bottom insulating layer, and then etching said top conductive layer to form a number of recesses in said top conductive layer;

b. embedding thin film resistive material in said recesses and enabling said first conductive layer to be electrically connected to lateral sides of said thin film resistive material;

c. plating a further conductive layer on top of said first conductive layer and said thin film resistive material to form a second conductive layer; and d. etching said second conductive layer to let said second conductive layer be electrically connected to said thin film type resistors.

2. The embedded resistor printed circuit board fabrication method as claimed in claim 1 wherein said thin film resistive material is embedded in said recesses by means screen printing.

3. The embedded resistor printed circuit board fabrication method as claimed in claim 2 wherein said screen printing method is used to print material for said thin film type resistors into said recesses twice, in opposite directions each time.

4. The embedded resistor printed circuit board fabrication method as claimed in claim 1 further comprising a sub-step of using a ceramic brush to brush the embedded resistive material after step b and before step c, keeping embedded resistive material flush with said first conductive layer.

5. The embedded resistor printed circuit board fabrication method as claimed in claim 1 further comprising a sub-step of coating a layer of resist on said second conductive layer with apertures smaller than said recesses above the embedded resistive material after step c and before step d.

6. The embedded resistor printed circuit board fabrication method as claimed in claim 5 further comprising a sub-step of removing said layer of resist from said second conductive layer after step d.

7. The embedded resistor printed circuit board fabrication method as claimed in claim 1 further comprising a sub-step of laminating multiple circuit substrates thus formed into a multilayer printed circuit board.

8. The embedded resistor printed circuit board fabrication method as claimed in claim 1, wherein the top conductive layer of said substrate and the thin conductive film plated on said first conductive layer are respectively formed of copper.

9. The embedded resistor printed circuit board fabrication method as claimed in claim 1, wherein the insulating layer of said substrate is made of epoxy resin composite.

10. A embedded resistor printed circuit board comprising:
an insulation layer;
a first conductive layer laid over the top side of said insulation layer and defining a number of recesses;
resistive material embedded in said recesses and electrically connected to said first conductive layer; and
a conductive layer laid over the top side of said first conductive layer opposite to said insulation layer, such that said first conductive layer, said resistive material and said second conductive layer are integrated into an electrical circuit, said second conductive layer having a pattern of layout the same as said first conductive layer.

11. The embedded resistor printed circuit board as claimed in claim 10 wherein said insulation layer is made of epoxy resin composite.

12. The embedded resistor printed circuit board as claimed in claim 10 wherein said first conductive layer and said second conductive layer are respectively made of copper.

* * * * *